United States Patent
Leoncavallo

(10) Patent No.: US 10,281,614 B2
(45) Date of Patent: May 7, 2019

(54) CIRCUIT ARRANGEMENT AND METHOD FOR DISTURBER DETECTION

(71) Applicant: ams AG, Unterpremstaetten (AT)

(72) Inventor: Ruggero Leoncavallo, Gratkorn (AT)

(73) Assignee: ams AG, Unterpremstaetten (AT)

( * ) Notice: Subject to any disclaimer, the term of this patent is extended or adjusted under 35 U.S.C. 154(b) by 816 days.

(21) Appl. No.: 14/412,992

(22) PCT Filed: Jun. 17, 2013

(86) PCT No.: PCT/EP2013/062508
§ 371 (c)(1),
(2) Date: Jan. 5, 2015

(87) PCT Pub. No.: WO2014/005827
PCT Pub. Date: Jan. 9, 2014

(65) Prior Publication Data
US 2015/0260880 A1    Sep. 17, 2015

(30) Foreign Application Priority Data

Jul. 6, 2012 (EP) .................................... 12175359

(51) Int. Cl.
| | |
|---|---|
| *G01W 1/16* | (2006.01) |
| *G01R 27/28* | (2006.01) |
| *G01R 29/26* | (2006.01) |
| *G01W 1/10* | (2006.01) |
| G01R 29/08 | (2006.01) |
| H04B 1/10 | (2006.01) |

(52) U.S. Cl.
CPC ............... *G01W 1/16* (2013.01); *G01R 27/28* (2013.01); *G01R 29/26* (2013.01); *G01W 1/10* (2013.01); *G01R 29/0842* (2013.01); *H04B 1/1027* (2013.01)

(58) Field of Classification Search
CPC .......... G01W 1/16; G01W 1/10; G01R 27/28; G01R 29/26; G01R 29/0842; H04B 1/1027
USPC ........................................ 324/620, 600, 612
See application file for complete search history.

(56) References Cited

U.S. PATENT DOCUMENTS

| | | | | |
|---|---|---|---|---|
| 5,534,784 A | * | 7/1996 | Lum .................. | G01R 1/07378 324/754.03 |
| 6,236,362 B1 | * | 5/2001 | Walley .................. | G01R 29/10 324/500 |
| 6,825,052 B2 | * | 11/2004 | Eldridge ............ | G01R 1/07307 257/E23.021 |

(Continued)

*Primary Examiner* — Giovanni Astacio-Oquendo
(74) *Attorney, Agent, or Firm* — Fish & Richardson P.C.

(57) ABSTRACT

In one embodiment a circuit arrangement for disturber detection comprises an input for receiving an input signal, the input being adapted to be coupled to an antenna, a receiver circuit coupled to the input which is configured to provide a demodulated signal as a function of the input signal, and a disturber rejection circuit which is coupled to an output of the receiver circuit. Therein the disturber rejection circuit is configured to provide a first signal indicative of a low energy disturber and/or a second signal indicative of a square envelope disturber, the first and second signals being provided as a function of the demodulated signal at respective outputs of the disturber rejection circuit. Furthermore, a lightning detector and a method for disturber detection are described.

20 Claims, 3 Drawing Sheets

(56) References Cited

U.S. PATENT DOCUMENTS

| | | | | |
|---|---|---|---|---|
| 7,081,764 B1* | 7/2006 | Pandya | ............... | H04B 3/487 |
| | | | | 324/539 |
| 8,994,376 B2* | 3/2015 | Billeres | ............... | A61B 5/097 |
| | | | | 324/260 |
| 2004/0155328 A1* | 8/2004 | Kline | ............... | H01L 23/49805 |
| | | | | 257/700 |
| 2005/0197070 A1 | 9/2005 | Kaikuranta et al. | | |
| 2007/0085525 A1 | 4/2007 | Jantunen et al. | | |
| 2007/0213843 A1 | 9/2007 | Jantunen et al. | | |
| 2008/0303138 A1* | 12/2008 | Flett | ............... | H01L 23/473 |
| | | | | 257/714 |
| 2010/0155888 A1* | 6/2010 | Christo | ............... | H01L 21/6835 |
| | | | | 257/532 |
| 2014/0355720 A1* | 12/2014 | Visweswaran | ............... | H03H 15/00 |
| | | | | 375/324 |
| 2016/0276747 A1* | 9/2016 | Davis | ............... | H01Q 3/14 |

* cited by examiner

CIRCUIT ARRANGEMENT AND METHOD FOR DISTURBER DETECTION

The present invention refers to the field of lightning detectors and especially to a circuit arrangement and a method for disturber detection.

BACKGROUND

A lightning detector is a system which can detect the presence of incoming thunder storms with lightning activities. Lightning is the result of flowing current due to the electrostatic charge separation in clouds. Typically this current is massive and can flow from the cloud to the ground or inside the cloud. The current flow generates an electromagnetic field.

From an electromagnetic point of view, lightning flashes produce very wide band signals. To monitor such a wide band frequency range with portable devices is very challenging. Lightning is a complex phenomenon made up of several different events: breakdown, return stroke, in-cloud activities and subsequent stroke. Scientific literature establishes that by analyzing the phenomenon using a narrow band system many details could be lost and it would no longer be possible to distinguish between the basic elementary processes which constitute lightning. Nevertheless, this approach is suitable for detecting lightning itself.

The subject application focuses on a narrow band radio frequency receiver which is to be used in a lightning detector. The receiver scans around a few hundred kilohertz up to a couple of megahertz as the central frequency. The challenge that comes with this lightning detection involves so-called manmade disturbers. Manmade disturbers can be classified in three different categories, namely low-energy signals, square envelope signals and continuous jamming noise.

There are known lightning detectors which evaluate the pattern of the incoming signal and subsequently perform an assessment. For this the received signal is digitized using, for instance, an analog-to-digital converter. An external unit then generates a histogram out of the sampled signal. These known systems are usually implemented in a digital signal processor, DSP, with high computing power. Power consumption of such DSP is in the range of 10 to 100 milliampere. Besides this, the solution is quite expensive.

One object consists of providing a circuit arrangement and method for disturber detection which enables reduced power consumption and an implementation at low cost.

SUMMARY

In one embodiment a circuit arrangement for disturber detection comprises an input for receiving an input signal, a receiver circuit coupled to the input and a disturber rejection circuit which is coupled to an output of the receiver circuit. The input is adapted to be coupled to an antenna. The receiver circuit is configured to provide a demodulated signal as a function of the input signal. The disturber rejection circuit is configured to provide a first signal indicative of a low energy disturber and/or a second signal indicative of a square envelope disturber. The first and second signals are provided as a function of the demodulated signal at respective outputs of the disturber rejection circuit. Furthermore, the disturber rejection circuit is configured to further provide an interrupt signal indicative of a continuous jammer. The interrupt signal is provided as a function of the demodulated signal.

The input receives the input signal via the antenna. The receiver circuit demodulates the input signal and provides the demodulated signal. The disturber rejection circuit analyzes the demodulated signal and provides the first signal which indicates the presence of a low energy disturber and/or the second signal which indicates the presence of a square envelope disturber.

As the circuit arrangement analyzes the demodulated signal, which is an analog signal, conversion of the input signal into a digital signal is avoided. Thereby, a low power and low cost implementation is enabled.

A low energy disturber signal is characterized by fast transitions of its envelope and a short decay time. Typically, these signals are caused by manmade sparks, e.g. in switches, engines or the like. A square envelope disturber is normally emitted by systems using pulse width modulation, for example, DC/DC converters.

In an example application the antenna that is to be connected to the circuit arrangement comprises an LC resonator. It can be realized, for instance, as a loop antenna which is based on a parallel LC resonator. The input signal received via the antenna can also be called "radio signal".

Signals generated by a jammer are characterized by a longer duration with an increased noise level. The interrupt signal signifies the presence of a continuous jammer and enables an adaptation of threshold values used in the disturber detection circuit arrangement with respect to the noise level.

In another embodiment the circuit arrangement further comprises a monitor circuit coupled to the output of the receiver circuit. The monitor circuit is prepared to provide an enabling signal as a function of the demodulated signal and a first threshold signal.

The monitor circuit observes the demodulated signal and provides the enabling signal as soon as the level of the demodulated signal exceeds the first threshold signal.

The first threshold signal thereby comprises an adjustable signal representative of a noise level of the input signal.

The monitor circuit can also be called a threshold watchdog.

By means of the interrupt signal the first threshold signal can be adapted when the noise level of the received signal exceeds a preset maximum value of acceptable noise due to the presence of a continuous jammer. Thereby, the robustness with respect to manmade disturbers is improved and the presence of lightning can still be detected even if a continuous jammer is nearby.

In another embodiment the circuit arrangement is adapted to be operated in either a listening mode or an active mode as a function of the enabling signal.

In a further development in the listening mode, the disturber rejection circuit is switched off and in the active mode the disturber rejection circuit is switched on.

Consequently, in the listening mode in which the level of the demodulated signal is below the first threshold signal and the enabling signal remains at low, just the receiver circuit is active and consumes power. Only if the level of the demodulated signal exceeds the first threshold signal does the circuit arrangement enter the active mode in which the disturber rejection circuit is switched on and subsequently checks the shape of the demodulated signal in order to classify it as a disturber or as a lightning.

As the disturber rejection circuit does not consume any power during the listening mode, the power consumption of the circuit arrangement is greatly reduced.

In one development the first signal is provided as a function of the demodulated signal and a noise signal.

A duration of the demodulated signal which is put in relation to the noise signal is used to differentiate between lightning and a potential manmade disturber. The duration of lightning is in the range of 10 milliseconds which is considerably longer than the duration of an impulse caused by a manmade spark, which is in the range of 100 nanoseconds to 50 microseconds.

The noise signal can, for instance, be provided by low pass filtering of the demodulated signal.

In a further development the second signal is provided as a function of the demodulated signal and a peak hold signal.

Holding a peak of the demodulated signal and comparing it with the demodulated signal at a slightly later point in time determines the decay time of the demodulated signal. A short decay time indicates that the impulse in the input signal which exceeded the first threshold signal is caused, for instance, by a DC/DC converter and not by lightning.

In another embodiment the receiver circuit comprises an amplifier which is coupled to the input and is configured to provide an amplified signal as a function of the input signal and a demodulator. The demodulator is coupled to the output of the amplifier and is configured to provide the demodulated signal as a function of the amplified signal at the output of the receiver circuit.

In the receiver circuit the input signal is amplified, e.g. by means of a low noise amplifier, and demodulated.

The demodulator can, for instance, be implemented using an envelope detector which extracts the envelope of the amplified radio signal.

The receiver circuit can also be denoted as the analog frontend. The bandwidth of the receiver circuit is meant to be greater than the antenna bandwidth so that the gain throughout the antenna bandwidth is constant.

In a further embodiment the monitor circuit comprises a first comparator having an input for receiving the demodulated signal, another input for receiving the first threshold signal and an output for providing the enabling signal as a function of a difference between the modulated signal and the first threshold signal.

In another embodiment the circuit arrangement further comprises a filtering circuit coupled to the output of the receiver circuit. The filtering circuit is configured to provide the noise signal representative of the noise of the input signal as a function of the demodulated signal.

The filtering circuit is realized, for instance, by using a low pass filter. It generates the noise signal from the demodulated signal. The noise signal is also designated as the AC ground noise. A time constant which is realized by the filtering circuit is much greater than a time constant of a filter which is implemented inside the demodulator. This enables detection of the level of noise of the demodulated signal.

In another embodiment the disturber rejection circuit comprises a first identification circuit configured to provide the first signal, a second identification circuit configured to provide the second signal and an interrupt generation circuit. The interrupt generation circuit is configured to provide the interrupt signal as a function of the noise signal and a fourth threshold signal.

The fourth threshold signal comprises, for example, a reference voltage representing a noise threshold. Whenever the noise signal crosses this noise threshold, the interrupt signal is provided signifying that high input noise is received in the input signal via the antenna. The interrupt signal indicates the presence of a continuous jammer in the vicinity of the circuit arrangement. This jammer is also classified as disturber in the disturber rejection circuit.

In a further development the first identification circuit comprises a second comparator which is configured to provide a duration signal as a function of the difference between the demodulated signal and the noise signal, the difference being relative to a second and a third threshold signal. Furthermore, the first identification circuit comprises a first counter coupled to an output of the second comparator. The first counter is configured to provide the first signal as a function of a length of an input of the duration signal.

As soon as the difference between the demodulated signal and the noise signal exceeds the second threshold signal the duration signal at the output of the second comparator changes to a high state. Whenever the difference subsequently reduces to below the third threshold signal, the duration signal changes to a low state. The first counter determines the length in time of this impulse of the duration signal. If the length of this impulse exceeds a preset value characteristic of the duration of a manmade spark, the first signal goes to high indicating lightning. Otherwise the first signal remains low signifying a disturber.

In another embodiment the second identification circuit comprises a peak holder circuit, a third comparator coupled to an output of the peak holder circuit, a latch coupled to an output of the third comparator and a second timer coupled to an output of the latch. The peak holder circuit is configured to provide the peak hold signal as a function of an impulse of the demodulated signal. The third comparator is configured to provide a comparison signal as a function of a difference between the peak hold signal and the demodulated signal. The latch is configured to provide an envelope signal as a function of the comparison signal and the duration signal. The second counter is configured to provide the second signal as a function of a length of an impulse of the envelope signal.

An impulse of the demodulated signal is identified and stored for a certain amount of time in the peak holder circuit and reflected in the peak hold signal. Whenever the difference between the peak hold signal and the demodulation signal exceeds a preset value, the comparison signal at the output of the third comparator is set to high. This high state sets the latch so that the envelope signal at the output of the latch also goes to high. The latch is reset by a falling edge of the duration signal resulting in a falling edge of the envelope signal. The second counter determines the length of an impulse of the envelope signal. The second signal is set to high if this length surpasses a preset value characteristic of a square envelope disturber. This high indicates lightning. Otherwise, in the presence of a disturber with short impulse duration, the second signal remains low.

The duration in time of an impulse of an envelope signal is proportional to the decay time of the input signal. The decay time of a disturber is much shorter than the decay time of lightning. Consequently, a square envelope disturber can be identified by means of the second signal.

In one embodiment a lightning detection circuit comprises a circuit arrangement for disturber detection as described above and a logic unit coupled to the outputs of the circuit arrangement for disturber detection. The logic unit has an output for providing a detection signal indicative of a lightning event as a function of the first and second signals provided at the outputs of the circuit arrangement for disturber detection.

The logic unit evaluates the first and second signals. In case first and second signals are high, the detection signal is also set to high, signifying the detection of lightning in the input signal. If the first and/or the second signal at the outputs of the circuit arrangement for disturber detection remain low, a disturber is detected. The detection signal also remains low. The impulse in the input signal caused by the disturber is filtered out. If the first and the second signal are high, the detection signal goes to high indicating the presence of lightning. A subsequent circuit may use the detection signal to estimate the distance to the leading edge of a thunder storm, for example.

The above-mentioned first, second, third and fourth comparators may each be realized as a so-called window comparator or as a comparator with hysteresis.

The mentioned first and second counters can also be implemented by means of a respective timer.

In one embodiment a method for disturber detection comprises the following steps:
receiving an input signal,
demodulating the input signal and providing a demodulated signal,
providing a first signal indicative of a low energy disturber,
providing a second signal indicative of a square envelope,
providing an interrupt signal indicative of a continuous jammer, the interrupt signal being provided as a function of the demodulated signal,
wherein the first and second signals are each provided as a function of the demodulated signal.

The described method for disturber detection is, for example, implemented within the circuit arrangement for disturber detection according to the invented principle.

BRIEF DESCRIPTION OF THE DRAWINGS

The text below explains aspects of the invention in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures, wherein.

DETAILED DESCRIPTION

Figure 1:
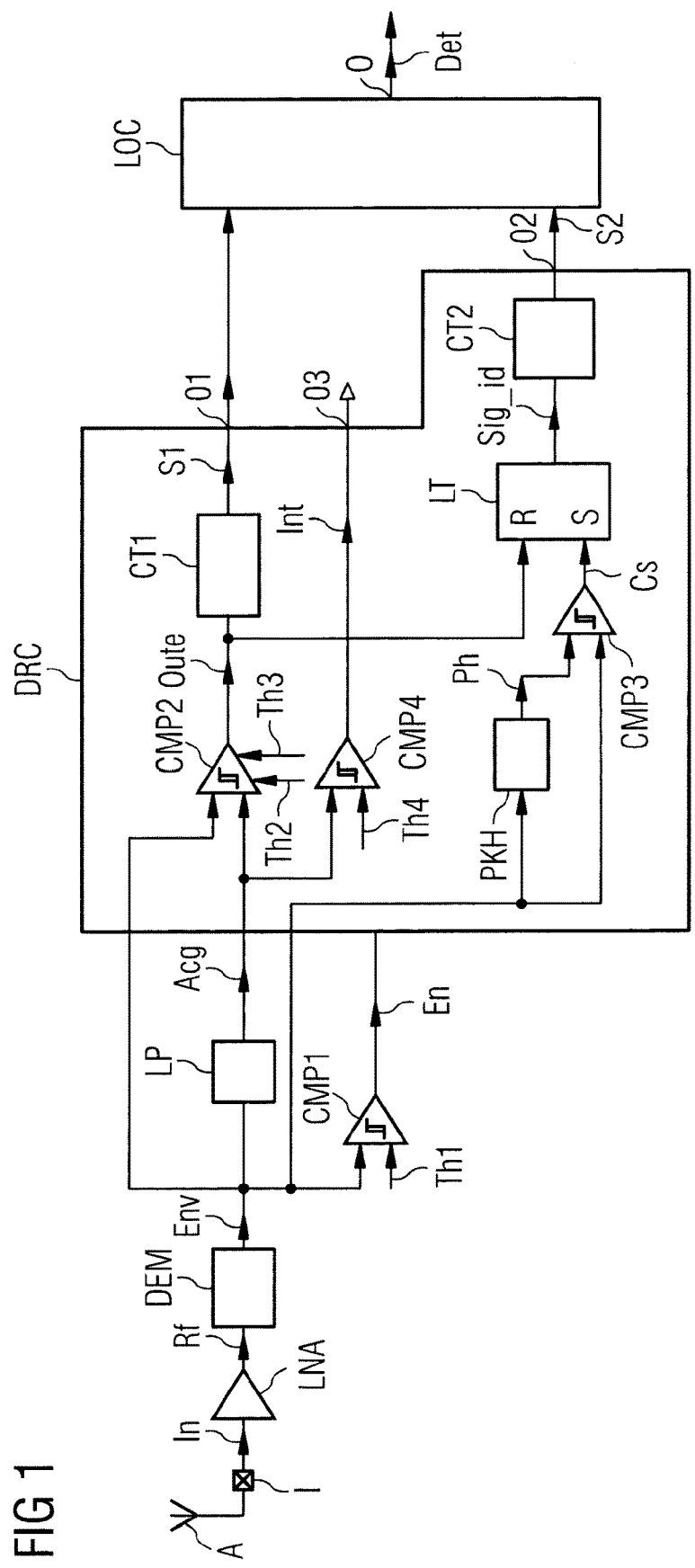
FIG. 1 shows an exemplary embodiment of a lightning detection circuit with an exemplary embodiment of a circuit arrangement for disturber detection.

FIG. 1 shows an exemplary embodiment of a lightning detector with an exemplary embodiment of a circuit arrangement for disturber detection. The circuit arrangement for disturber detection comprises an input I for receiving an input signal In and three outputs O1, O2, O3. It further comprises a receiver circuit with an amplifier LNA and a demodulator DEM, and a monitor circuit coupled to an output of the receiving circuit. The monitor circuit comprises a first comparator CMP1. The circuit arrangement for disturber detection further comprises a filtering circuit LP coupled to the output of the receiver circuit as well as a disturber rejection circuit DRC. The input I is prepared to be coupled to an antenna A. The receiver circuit is coupled to the input I.

In the receiver circuit the input signal In is amplified by the amplifier to a radio signal Rf and demodulated by the demodulator to the demodulated signal Env. The first comparator CMP1 receives the demodulated signal Env and a first threshold signal Th1. It provides an enabling signal En as a function of the difference between the demodulated signal Env and the first threshold signal Th1. The filtering circuit LP receives the demodulated signal Env and provides therefrom a noise signal Acg by means of low pass filtering of the demodulated signal Env.

The disturber rejection circuit DRC comprises a first identification circuit providing a first signal S1 with a second comparator CMP2 and a first counter CT1. The first signal S1 is provided at an output O1. The disturber rejection circuit DRC further comprises a second identification circuit with a peak holder circuit PKH, a third comparator CMP3, a latch LT and a second counter CT2. The second identification circuit provides the second signal S2 at an output O2. Finally, the disturber rejection circuit DRC comprises an interrupt generation circuit with a fourth comparator CMP4 for providing an interrupt signal Int at an output O3 of the circuit arrangement for disturber detection.

In the first identification circuit the second comparator CMP2 receives the demodulated signal Env and the noise signal Acg. The second comparator CMP2 provides a duration signal Oute depending on a difference between the demodulated signal Env and the noise signal Acg in relation to a second and a third threshold signal Th2, Th3. The first counter CT1 receives the duration signal Oute and provides first signal S1 as a function of the duration of an impulse of the duration signal Oute.

The peak holder circuit PKH of the second identification circuit receives the demodulated signal Env and holds an impulse or a peak occurring within the demodulated signal Env for the duration of an impulse of the duration signal Oute. A peak hold signal Ph is provided accordingly. The third comparator CMP3 compares the peak hold signal Ph to the demodulated signal Env and provides a rising edge of a comparison signal Cs at its output as soon as the difference between peak hold signal Ph and demodulated signal Env exceeds a certain preset threshold. The preset threshold can be, for instance, 40%. By means of the rising edge of the comparison signal Cs, the latch LT is set. The latch may be implemented, for example, by means of an RS flipflop. When setting the latch LT, an envelope signal Sig_id at its output reflects a rising edge. The latch LT is reset by a falling edge of the duration signal Oute. The second counter CT2 determines a duration of an impulse of the envelope signal Sig_id and provides the second signal S2 accordingly.

The interrupt generation circuit receives the noise signal Acg and a fourth threshold signal indicative of a noise floor threshold and provides the interrupt signal Int when the noise signal Acg exceeds the fourth threshold signal Th4.

The lightning detection circuit additionally comprises a logic unit LOC which is coupled to the first and second outputs O1, O2 of the circuit arrangement for disturber detection. The logic unit LOC provides a detection signal Det at an output O of the lightning detector as a function of the first and second signals S1, S2.

The dynamic behaviour of the circuit arrangement for disturber detection will be explained below with the help of signal diagrams of FIGS. 2 to 4.

Figure 2:
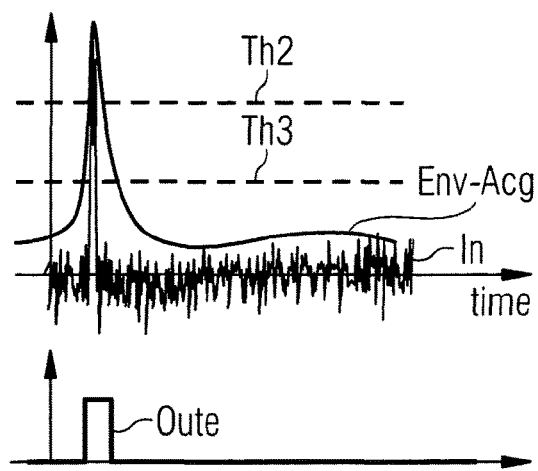
FIG. 2 shows exemplary signal diagrams for the first identification circuit of FIG. 1.

FIG. 2 shows exemplary signal diagrams for the first identification circuit of FIG. 1. All the signals depicted are related to time. The upper diagram of FIG. 2 shows the input signal In, the second and third threshold signals Th2, Th3 and the difference between the demodulated signal Env and the noise signal Acg. The lower diagram of FIG. 2 shows the duration signal Oute. Whenever the difference between the demodulated signal Env and the noise signal Acg surpasses the second threshold signal Th2, the duration signal Oute goes to logic high. As soon as the difference between the demodulated signal Env and the noise signal Acg decreases below the third threshold signal Th3, the duration signal Oute goes back to logic low. In an exemplary implementation the second threshold signal Th2 is set to approximately 60 milli volts above the noise signal Acg and the third threshold signal is set to approximately 120 milli volts above the noise signal Acg.

The first counter CT1 in FIG. 1 determines a duration of an impulse of the duration signal Oute. An impulse duration between 100 nanoseconds and 50 microseconds signifies the presence of a disturber, whereas an impulse duration of around 10 milliseconds signals the presence of lightning.

Figure 3:
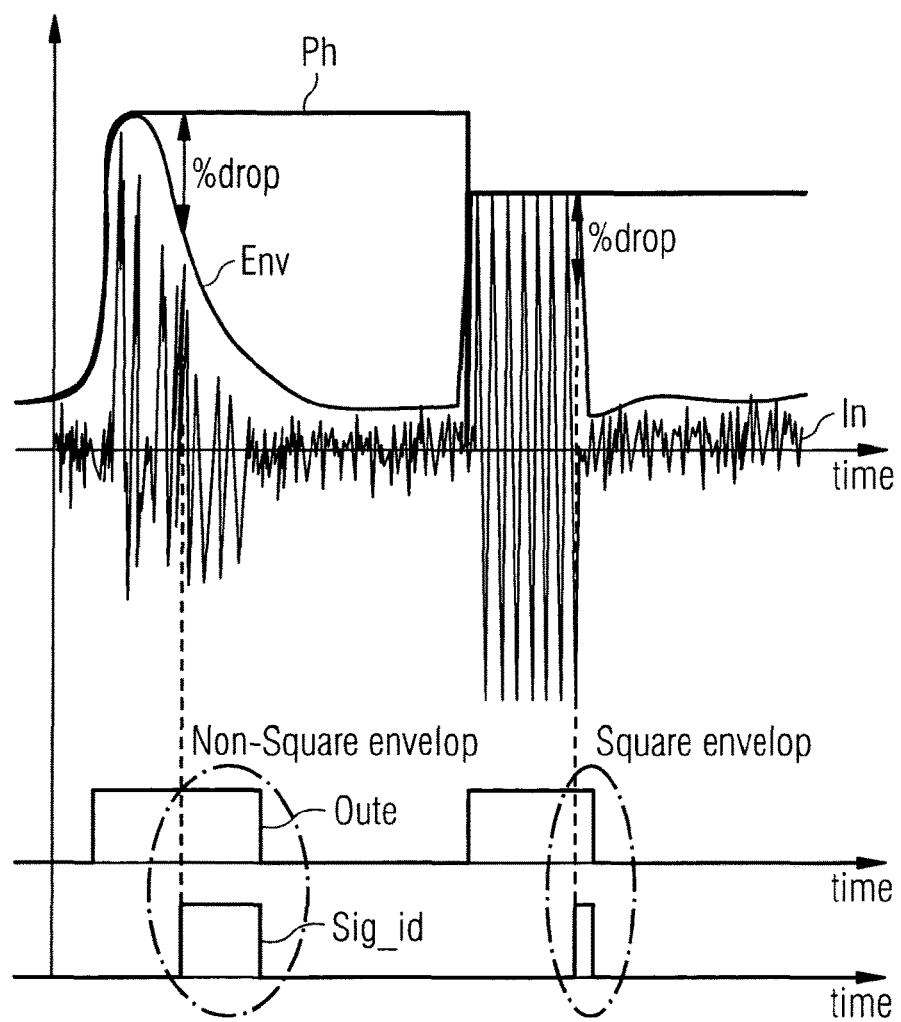
FIG. 3 shows exemplary signal diagrams for the second identification circuit of FIG. 1.

FIG. 3 shows exemplary signal diagrams for the second identification circuit of FIG. 1. The upper diagram shows the peak hold signal Ph, the demodulated signal Env and the input signal In. The diagram in the middle of FIG. 3 shows the duration signal Oute. The diagram in the bottom of FIG. 3 shows the envelope signal Sig_id.

The peak hold signal Ph samples an impulse of the demodulated signal Env and stores it for a certain amount of time. The difference between the peak hold signal Ph and the demodulated signal Env represents the drop ratio of the input signal In, also denoted as the decay time. The third comparator CMP3 of FIG. 1 supervises the decay time of the input signal In and provides an impulse at its output if the difference between the peak hold signal Ph and the demodulated signal Env surpasses a preprogrammed value, e.g. 40%. In this event, the envelope signal Sig_id goes to logic high. Together with a falling edge of the duration signal Oute, the envelope signal Sig_id also goes to logic low.

The duration in time between the rising edge of the envelope signal Sig_id and its subsequent falling edge is determined in the second counter CT2 of FIG. 1 and is reflected in the second signal S2. A short impulse of the envelope signal Sig_id is an indication for a square envelope of the input signal In. This is depicted, for example, in the second impulse of the envelope signal Sig_id at the bottom of FIG. 2. As can be discerned from the upper diagram, the second series of impulses in the input signal In has a square envelope resulting typically from a PWM system like a DC/DC converter. The first series of impulses in the input signal In has a triangular shaped envelope which is reflected in an impulse having a much longer duration in the envelope signal Sig_id depicted in the left impulse of the bottom diagram.

Consequently, a non-square envelope resulting from lightning can be differentiated from a square envelope resulting from a disturber.

Figure 4:
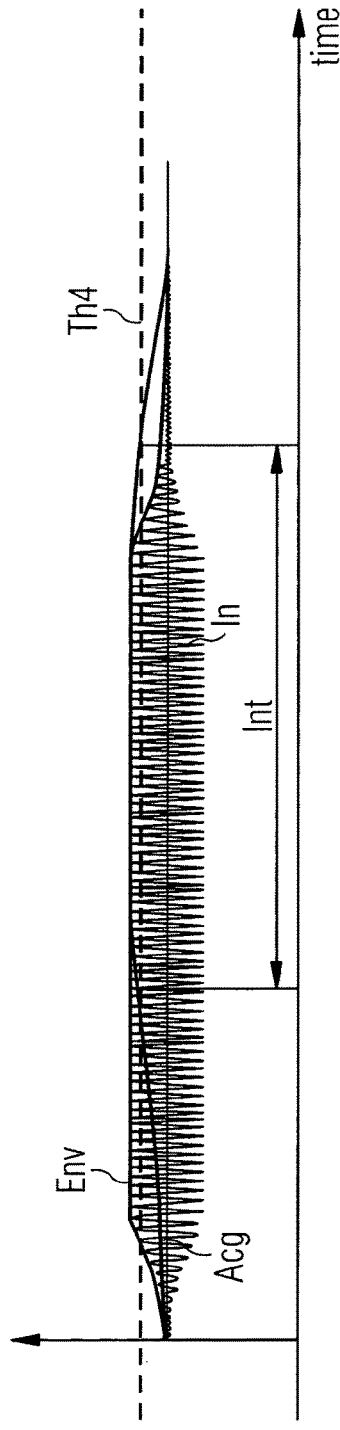
FIG. 4 shows exemplary signal diagrams for the interrupt generation circuit of FIG. 1.

FIG. 4 shows exemplary diagrams for the interrupt generation circuit of FIG. 1. The upper diagram shows the demodulated signal Env, the noise signal Acg, the input signal In and the fourth threshold signal Th4. The lower diagram shows the interrupt signal Int. It can be seen that due to a jammer which produces a continuously high noise signal reflected in the input signal In, the noise signal Acg at the output of the filtering circuit LP of FIG. 1 exceeds the fourth threshold signal Th4. This results in a rising edge of the interrupt signal Int. When the noise signal Acg decreases below the level of the fourth threshold signal Th4, the interrupt signal Int goes back to low.

As a result, the absolute value of the noise floor in the input signal In is monitored continuously and a superordinate system is warned by an impulse of the interrupt signal Int that a continuous noise has jammed the analog frontend of the disturber detection circuit of FIG. 1. The level of the first threshold signal Th1 can subsequently be adapted to keep the disturber detection circuit arrangement in the listening mode as long as possible which consumes only little power as the disturber rejection circuit is switched off.

Advantageously, by using the circuit arrangement for disturber detection false triggers caused by manmade disturbers can be detected and subsequently rejected so that the lightning detector is only activated in the case of real lightning.

Figure 5:
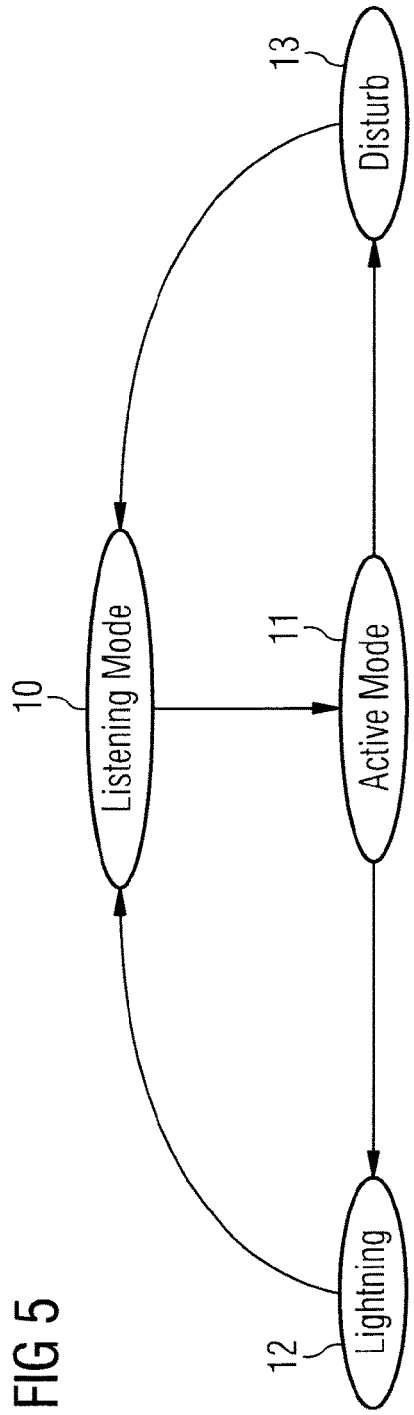
FIG. 5 shows an exemplary state transition diagram for FIG. 1.

FIG. 5 shows an exemplary state transition diagram for the circuits of FIG. 1. Four states 10, 11, 12 and 13 are depicted. State 10 represents the listening mode in which the demodulated signal Env from FIG. 1 is continuously monitored by comparison with the first threshold signal Th1 in the monitoring circuit of FIG. 1. As soon as the demodulated signal Env exceeds the first threshold signal Th1, the enabling signal En is generated and the active mode is entered. States 11, 12 and 13 each belong to the active mode. In state 11 the disturber rejection circuit DRC of FIG. 1 is activated. Evaluation of the shape of the demodulated signal Env is conducted in the first and second identification circuit, as well as in the interrupt generation circuit of FIG. 1. If the first signal S1 remains at low because of a too short impulse of the duration signal Oute and/or if the second signal remains at low because of a too short impulse of the envelope signal Sig_id signifying a square envelope and/or if the interrupt signal Int is at high, state 13 is entered. A disturber is consequently detected. Subsequently state 10 is assumed and the circuit goes back to the listening mode.

If, on the other hand, in state 11 the first signal S1 and the second signal S2 are at logic high concurrently with a logic low in the interrupt signal Int, lightning is detected and state 12 is assumed. The detection signal Det of FIG. 1 is set to logic high to inform a superordinate circuit. Subsequently, state 10 is assumed again with power-saving in the listening mode.

The logic circuit LOC can be realized by using, for example, an AND or an OR gate.

As the circuit arrangement according to an aspect of the invention is based on an analog frontend and subsequent analog and digital circuit components, only analog signals have to be analyzed within the circuit components. This enables a low cost implementation as an expensive DSP for digital evaluation in the high frequency range can be avoided. The generated digital signals, for example, the duration signal Oute and the envelope signal Sig_id, have a considerably lower frequency than the input signal In. This further reduces the power consumption.

Despite using a narrow band frontend, disturbers can be securely detected and subsequently rejected. By continuously monitoring the demodulated signal and only activating the disturber rejection circuit if this demodulated signal surpasses a certain threshold, energy is saved.

The invention claimed is:

1. A circuit arrangement for disturber detection, comprising:
  an input for receiving an input signal, the input being adapted to be coupled to an antenna,
  a receiver circuit coupled to the input which is configured to provide a demodulated signal as a function of the input signal,
  a disturber rejection circuit which is coupled to an output of the receiver circuit, wherein the disturber rejection circuit is configured to provide a first signal indicative of a low energy disturber and/or a second signal indicative of a square envelope disturber, the first and second signals being provided as a function of the demodulated signal at respective outputs of the disturber rejection circuit, wherein the disturber rejection circuit is further configured to provide an interrupt signal indicative of a continuous jammer, the interrupt signal being provided as a function of the demodulated signal.

2. The circuit arrangement according to claim 1, further comprising:
a monitor circuit coupled to the output of the receiver circuit which is prepared to provide an enabling signal as a function of the demodulated signal and a first threshold signal.

3. The circuit arrangement according to claim 2, which is adapted to be operated in either a listening mode or an active mode as a function of the enabling signal.

4. The circuit arrangement according to claim 3, wherein in the listening mode the disturber rejection circuit is switched off and in the active mode the disturber rejection circuit is switched on.

5. The circuit arrangement according to claim 1 or 2, wherein the first signal is provided as a function of the demodulated signal and a noise signal.

6. The circuit arrangement according to claim 5, further comprising:
a filtering circuit coupled to the output of the receiver circuit, the filtering circuit being configured to provide the noise signal representative of the noise of the input signal as a function of the demodulated signal.

7. The circuit arrangement according to claim 6, wherein the disturber rejection circuit comprises:
a first identification circuit which is configured to provide the first signal,
a second identification circuit which is configured to provide the second signal, and
an interrupt generation circuit which is configured to provide the interrupt signal as a function of a noise signal and a fourth threshold signal.

8. The circuit arrangement according to claim 7, wherein the first identification circuit comprises:
a second comparator which is configured to provide a duration signal as a function of a difference between the demodulated signal and the noise signal, the difference being relative to a second and a third threshold signal, and
a first counter coupled to an output of the second comparator, the first counter being configured to provide the first signal as a function of a length of an impulse of the duration signal.

9. The circuit arrangement according to claim 8, wherein the second identification circuit comprises:
a peak holder circuit which is configured to provide a peak hold signal as a function of an impulse of the demodulated signal,
a third comparator coupled to an output of the peak holder circuit, the third comparator being configured to provide a comparison signal as a function of a difference between the peak hold signal and the demodulated signal,
a latch coupled to an output of the third comparator, the latch being configured to provide an envelope signal as a function of the comparison signal and the duration signal, and a second counter coupled to an output of the latch, the second counter being configured to provide the second signal as a function of a length of an impulse of the envelope signal.

10. A lightning detection circuit comprising:
a circuit arrangement for disturber detection according to claim 9, and
a logic unit coupled to the outputs of the circuit arrangement for disturber detection,
wherein the logic unit has an output for providing a detection signal indicative of a lightning event as a function of the first and second signals provided at the outputs of the circuit arrangement for disturber rejection.

11. The circuit arrangement according to claim 1 or 2, wherein the second signal is provided as a function of the demodulated signal and a peak hold signal.

12. The circuit arrangement according to claim 1 or 2, wherein the receiver circuit comprises:
an amplifier which is coupled to the input and is configured to provide an amplified signal as a function of the input signal at its output, and
a demodulator which is coupled to the output of the amplifier and is configured to provide the demodulated signal as a function of the amplified signal at the output of the receiver circuit.

13. The circuit arrangement according to claim 2, wherein the monitor circuit comprises:
a first comparator having an input for receiving the demodulated signal, another input for receiving the first threshold signal and an output for providing the enabling signal as a function of a difference between the demodulated signal and the first threshold signal.

14. The circuit arrangement according to claim 1 or 2, further comprising:
a filtering circuit coupled to the output of the receiver circuit, the filtering circuit being configured to provide a noise signal representative of the noise of the input signal as a function of the demodulated signal.

15. The circuit arrangement according to claim 1, wherein the disturber rejection circuit comprises:
a first identification circuit which is configured to provide the first signal,
a second identification circuit which is configured to provide the second signal, and
an interrupt generation circuit which is configured to provide the interrupt signal as a function of a noise signal and a fourth threshold signal.

16. The circuit arrangement according to claim 15, wherein the first identification circuit comprises:
a second comparator which is configured to provide a duration signal as a function of a difference between the demodulated signal and the noise signal, the difference being relative to a second and a third threshold signal, and
a first counter coupled to an output of the second comparator, the first counter being configured to provide the first signal as a function of a length of an impulse of the duration signal.

17. The circuit arrangement according to claim 16, wherein the second identification circuit comprises:
a peak holder circuit which is configured to provide a peak hold signal as a function of an impulse of the demodulated signal,
a third comparator coupled to an output of the peak holder circuit, the third comparator being configured to provide a comparison signal as a function of a difference between the peak hold signal and the demodulated signal, a latch coupled to an output of the third comparator, the latch being configured to provide an envelope signal as a function of the comparison signal and the duration signal, and a second counter coupled to an output of the latch, the second counter being configured to provide the second signal as a function of a length of an impulse of the envelope signal.

18. A lightning detection circuit, comprising:
a circuit arrangement for disturber detection according to claim 1 or 2, and
a logic unit coupled to the outputs of the circuit arrangement for disturber detection,
wherein the logic unit has an output for providing a detection signal indicative of a lightning event as a function of the first and second signals provided at the outputs of the circuit arrangement for disturber rejection.

19. A method for disturber detection comprising the following steps:
receiving an input signal,
demodulating, by a receiver circuit coupled to the input, the input signal to provide a demodulated signal,
providing, by a disturber rejection circuit coupled to an output of the receiver circuit, a first signal indicative of a low energy disturber,
providing, by the disturber rejection circuit, a second signal indicative of a square envelope,
providing, by the disturber rejection circuit, an interrupt signals indicative of continuous jammer, the interrupt signal being provided as a function of the demodulated signal,
wherein the first and second signals are each provided as a function of the demodulated signal.

20. A circuit arrangement for disturber detection, comprising:
an input for receiving an input signal, the input being adapted to be coupled to an antenna,
a receiver circuit coupled to the input which is configured to provide a demodulated signal as a function of the input signal,
a disturber rejection circuit which is coupled to an output of the receiver circuit,
wherein the disturber rejection circuit is configured to provide a first signal indicative of a low energy disturber and/or a second signal indicative of a square envelope disturber, the first and second signals being provided as a function of the demodulated signal at respective outputs of the disturber rejection circuit.

* * * * *

UNITED STATES PATENT AND TRADEMARK OFFICE
CERTIFICATE OF CORRECTION

| | | |
|---|---|---|
| PATENT NO. | : 10,281,614 B2 | Page 1 of 1 |
| APPLICATION NO. | : 14/412992 | |
| DATED | : May 7, 2019 | |
| INVENTOR(S) | : Ruggero Leoncavallo | |

It is certified that error appears in the above-identified patent and that said Letters Patent is hereby corrected as shown below:

In the Claims

<u>Claim 14, Column 11:</u>
Line 25, delete "receiving," and insert -- receiving, by an input, --.

<u>Claim 14, Column 12:</u>
Line 7, delete "signals" and insert -- signal --.
Line 7, delete "of" and insert -- of a --.

Signed and Sealed this
Sixteenth Day of July, 2019

Andrei Iancu
*Director of the United States Patent and Trademark Office*